United States Patent
Blair et al.

(10) Patent No.: US 6,171,901 B1
(45) Date of Patent: Jan. 9, 2001

(54) PROCESS FOR FORMING SILICIDED CAPACITOR UTILIZING OXIDATION BARRIER LAYER

(75) Inventors: Christopher S. Blair; Weidong Chen, both of San Jose, CA (US)

(73) Assignee: National Semiconductor Corporation, Santa Clara, CA (US)

(*) Notice: Under 35 U.S.C. 154(b), the term of this patent shall be extended for 0 days.

(21) Appl. No.: 09/356,012

(22) Filed: Jul. 16, 1999

(51) Int. Cl.[7] .............................................. H01L 21/8242

(52) U.S. Cl. .......................... 438/250; 438/393; 438/655; 438/682

(58) Field of Search .................................... 438/238–256, 438/381–399, 649, 651, 682, 655

(56) References Cited

U.S. PATENT DOCUMENTS 4,971,924 * 11/1990 Tigelaar et al. .
5,631,188 * 5/1997 Chang et al. ........................ 438/253

OTHER PUBLICATIONS

Chen, Ih–Chin, et al. "Microelectronic Device and Multi-level Interconnection Technology II", SPIE vol. 2875, pp. 188–200 (1996).

* cited by examiner

*Primary Examiner*—Jey Tsai
(74) *Attorney, Agent, or Firm*—Limbach & Limbach LLP

(57) ABSTRACT

A process flow for forming a polysilicon-to-polysilicon capacitor performs the capacitor anneal step in a nitrous oxide ambient. As a result, a nitroxide layer forms over heavily doped polysilicon of the upper electrode of the capacitor. This nitroxide layer acts as a barrier against the diffusion of oxygen, preventing further oxidation of the heavily doped polysilicon electrode layer during the subsequent seal oxidation step. The nitroxide barrier layer is readily removed along with the other seal oxide layers immediately before formation of the silicided capacitor electrode contacts, without any attendant danger of overetching of gate oxide or spacer structures. Where the gate polysilicon layer is doped immediately after its formation, an additional capacitor anneal step in a nitrous oxide ambient is necessary to form an additional nitroxide layer.

20 Claims, 7 Drawing Sheets

PROCESS FOR FORMING SILICIDED CAPACITOR UTILIZING OXIDATION BARRIER LAYER

BACKGROUND OF THE INVENTION

1. Field of the Invention

The present invention relates to a process for forming a capacitor structure for an integrated circuit, and in particular, to a process flow which features reduced oxide growth at capacitor electrode contact regions prior to the formation of silicide.

2. Description of the Related Art

It is common to incorporate passive devices in integrated circuits in mixed-signal devices. The polysilicon-to-polysilicon capacitor is a useful device due to its relatively ease of formation and its superiority in performance over a gate oxide capacitor in many applications.

FIG. 1 shows a cross-sectional view of a conventional polysilicon-to-polysilicon capacitor structure. Capacitor 100 is formed over a field oxide region 102 of an integrated circuit. Capacitor 100 includes a heavily doped lower polysilicon electrode 104 separated from a heavily doped upper polysilicon electrode 106 by an intervening dielectric layer 108. Both lower and upper electrodes 104 and 106 include dielectric spacer structures 110.

Lower polysilicon electrode 104 includes a first silicide contact 112. Upper electrode 106 includes a second silicide contact 114. Silicide contacts 112 and 114 provide low resistance electrical pathways to electrodes 104 and 106 respectively, of capacitor 100.

It is problematic to form silicide contacts 112 and 114 in a self-aligned fashion in conjunction with formation of silicide source/gate/drain contacts of an associated CMOS structure. This is illustrated below in conjunction with FIGS. 2A–2L.

FIGS. 2A–2L illustrate cross-sectional views of the conventional process flow for forming the polysilicon-to-polysilicon capacitor shown in FIG. 1. FIG. 2A shows the first step of this process, wherein gate oxide layer 116 is formed over single-crystal silicon region 118 located adjacent to field oxide region 102. Undoped gate polysilicon layer 120 is then formed over gate oxide layer 116 and field oxide region 102.

FIG. 2B shows patterning of capacitor implant mask 122, followed by ion implantation of conductivity-altering dopant into exposed first region 150 of gate polysilicon layer 120. Regions of gate polysilicon layer 120 exposed to implantation in this step will form part of the lower electrode of the capacitor device.

FIG. 2C shows removal of the capacitor implant mask, followed by formation of a CMOS mask 124 which covers single crystal silicon region 118. Capacitor oxide layer 108 is then formed over both doped and undoped portions of gate polysilicon layer 120. Capacitor polysilicon layer 126 is then formed over capacitor oxide layer 108. Capacitor polysilicon layer 126 is then heavily doped by ion implantation.

FIG. 2D shows the capacitor anneal step, wherein the heavily-doped capacitor polysilicon layer 126 is heated in the presence of $N_2$ gas to promote even distribution of implanted dopant throughout capacitor polysilicon layer 126.

FIG. 2E shows removal of the CMOS mask, followed by formation of a capacitor poly mask 128 covering first region 150 and the portion of capacitor polysilicon layer 126 which will later form the upper electrode. Capacitor polysilicon layer 126 and capacitor oxide layer 108 in unmasked areas are then etched.

FIG. 2F shows removal of the capacitor poly mask, followed by patterning of gate poly mask 130 over a second region 152. Second region 152 is larger than and encompasses the first region. Gate poly mask 130 covers portions of gate polysilicon layer 120 that will form the lower electrode of the capacitor, and also covers the gate of the CMOS device. Portions of gate polysilicon layer 120 excluded from mask 130 are then etched to form lower electrode 104 of the precursor capacitor, as well as gate 132 of the precursor CMOS device. At this point in the process, lower electrode 104 includes a heavily-doped portion 104a and an undoped portion 104b.

FIG. 2G shows exposing the precursor capacitor and CMOS structures to thermally oxidizing conditions. As a result, seal oxide layer 134a is formed over the surface of single crystal silicon 118, seal oxide layer 134b is formed over the exposed surfaces of undoped portions 104b of the remaining gate polysilicon, and seal oxide layer 134c is formed over the heavily doped surface of upper polysilicon capacitor electrode 106.

Seal oxide layer 134c has significantly greater thickness than either seal oxide layer 134a overlying single crystal silicon 118, or seal oxide layer 134b overlying the undoped portion 104b of lower capacitor electrode 104. This is because increasing the dopant concentration of polysilicon results in a pronounced increase in oxidation. As discussed below, the additional thickness of seal oxide layer 134c poses difficulties in later forming a silicide contact with upper capacitor electrode 106.

FIG. 2H shows formation of lightly-doped-drain (LDD) mask 136, followed by implantation of conductivity-altering dopant in unmasked regions to form LDD regions 138 in single-crystal silicon 118. Also during this step, dopant is introduced into the gate polysilicon 132 and also into the formerly undoped portion 104b of lower electrode 104.

FIG. 2I shows removal of the LDD mask, followed by the formation of spacer structures 110. Spacer structures 110 are typically produced by anisotropic etching of a conforming deposited dielectric layer.

FIG. 2J shows patterning of source/drain mask 138, followed by implantation of high doses of conductivity altering dopant into unmasked regions to form source/drain 140 and gate 132 of CMOS device 142. Also during the step, additional dopant is again introduced into formerly undoped portion 104b of lower electrode 104, raising the doping of portion 104b to approximately that of doped portion 104a.

FIG. 2K shows the removal of seal oxide layers 134a, 134b, and 134c in preparation for forming silicided contacts with the upper and lower electrodes of the capacitor structure, and also with the source, gate, and drain of the CMOS device. Seal oxide layers 134a, 134b, and 134 are removed with HF etchants.

FIG. 2L shows the formation of silicide contacts with the capacitor and CMOS device. Specifically, a silicide mask (not shown) is patterned which exposes the surface of the upper and lower capacitor electrodes, as well as the surface of the source, gate, and drain of the CMOS device. A layer of refractory metal is formed over these exposed surfaces. The metal/silicon combination is then alloyed to produce silicide contacts 114 and 112 over upper and lower electrodes 106 and 104 of capacitor 100, as well as silicide contacts 144 over the source 140, gate 132, and drain 140 of CMOS device 142. This step completes the conventional front-end process flow for the polysilicon-to-polysilicon capacitor structure.

It is critical for polysilicon-to-polysilicon capacitors to have heavily doped electrodes. Unfortunately, however, heavily doped polysilicon oxidizes to a thickness of up to 4 times that of undoped polysilicon. Because of this, the process described above in FIGS. 2A–2L suffers from one serious disadvantage during formation of silicided contacts to the capacitor.

As described in connection with FIG. 2G, the elevated rate of oxidation of heavily doped polysilicon produces an especially thick seal oxide layer over the upper capacitor electrode. In order to remove this thick oxide layer prior to the formation of silicide contacts, extended exposure to HF etchants is required. This prolonged etchant exposure can lead to degradation of the delicate spacer structures, possibly destroying the capacitor and/or CMOS device. This is graphically illustrated in FIG. 2K, wherein the prolonged exposure to HF etchant required to remove seal oxide layer 134c has partially eroded spacers 110.

Therefore, there is a need in the art for a process for forming a capacitor structure which avoids excessive build up of oxide on heavily doped electrode polysilicon regions that could interfere with the formation of silicided electrode contacts.

SUMMARY OF THE INVENTION

A polysilicon-to-polysilicon capacitor is formed in a process flow in which the capacitor anneal step is performed in a nitrous oxide ambient. This capacitor anneal step produces a nitroxide layer over the heavily doped upper polysilicon capacitor electrode. This nitroxide layer serves as a barrier to further oxidation of the heavily doped polysilicon layer. Moreover, the nitroxide barrier layer is readily removed along with the other seal oxide layers immediately prior to formation of the silicided contacts, without any attendant danger of overetching of the spacer structures.

A process flow for forming a pixel cell in accordance with one embodiment of the present invention comprises the steps of forming a gate polysilicon layer over a semiconductor workpiece, forming a gate oxide layer over the gate polysilicon layer, and forming a capacitor polysilicon layer over the gate oxide layer. Conductivity-altering dopant is introduced into the capacitor polysilicon layer, and a first nitroxide barrier layer is formed over the capacitor polysilicon layer. An upper electrode of a capacitor structure is formed by removing the first nitroxide barrier layer, the capacitor polysilicon layer, and the gate oxide layer to stop on the gate polysilicon layer outside of a first region. A lower electrode of the capacitor structure is formed by removing the gate polysilicon layer to stop on the semiconductor workpiece outside of a second region, the second region larger than and encompassing the first region. The first nitroxide barrier layer is removed from over the upper capacitor electrode, and a silicide contact is formed over the upper capacitor electrode and the lower capacitor electrode.

The features and advantages of the present invention will be understood upon consideration of the following detailed description of the invention and the accompanying drawings.

DETAILED DESCRIPTION

The present invention describes a process flow for forming a polysilicon-to-polysilicon capacitor device having silicided electrode contacts, in which the capacitor anneal step is carried out in an ambient of nitrous oxide (NO) rather in an ambient of nitrogen ($N_2$). As a result of this change in ambient, a nitroxide film is formed over the heavily doped polysilicon of the upper electrode. This nitroxide layer functions as a barrier to further oxidation of the heavily doped polysilicon of the upper capacitor electrode, preventing build-up of a thick seal oxide and thereby eliminating any problems associated with removal of the seal oxide prior to formation of silicided electrode contacts.

Figure 1:
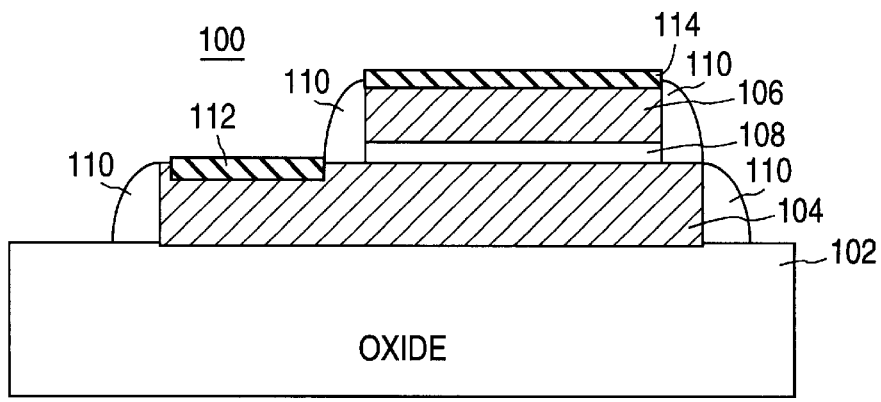
FIG. 1 shows a cross-sectional view of a conventional polysilicon-to-polysilicon capacitor structure.
Figure 2A:
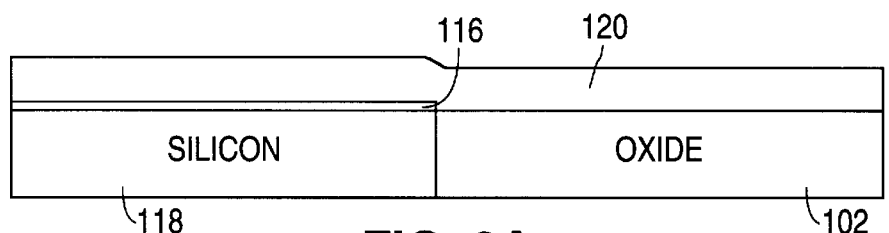
FIGS. 2A–2L shows cross-sectional views of the conventional process flow for forming the capacitor structure of FIG. 1.
Figure 2B:
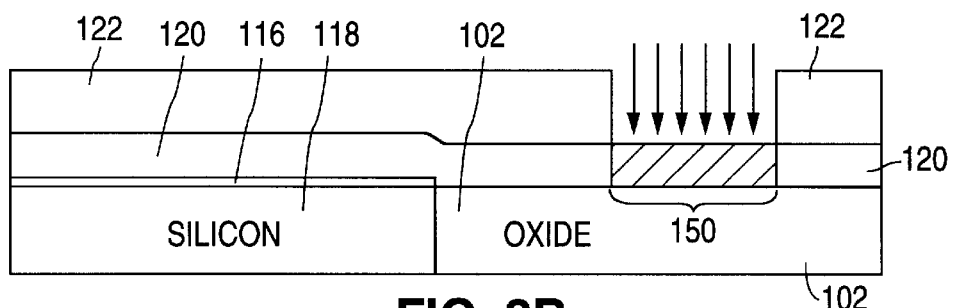
Figure 2C:
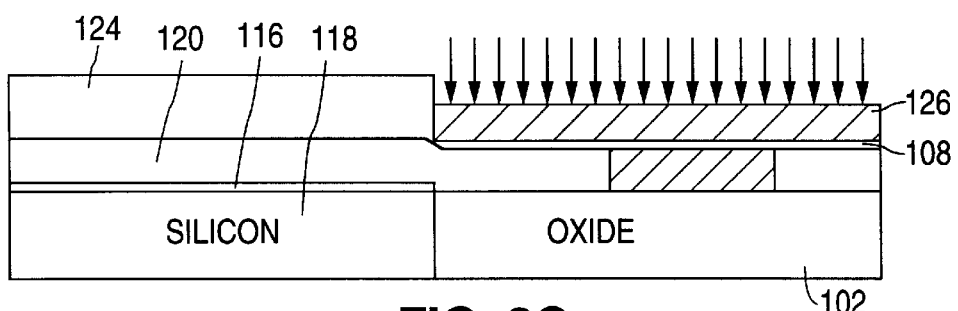
Figure 2D:
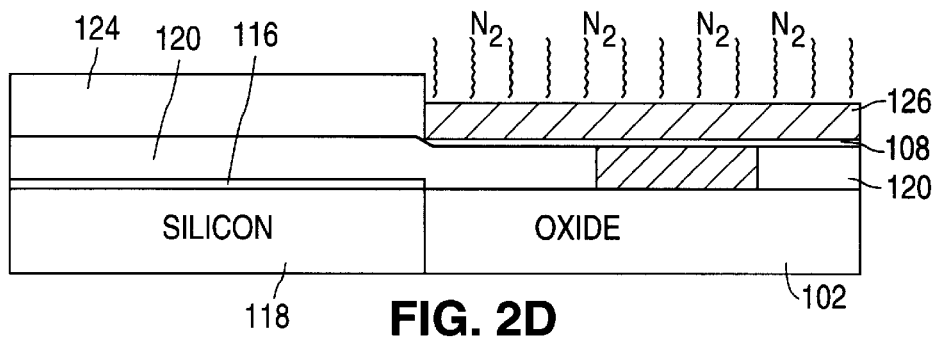
Figure 2E:
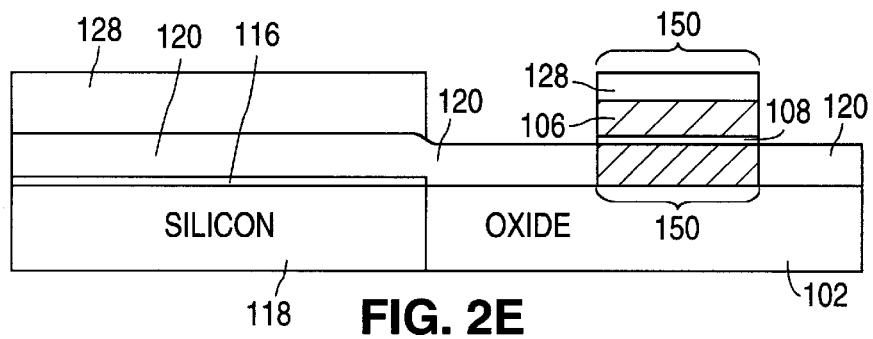
Figure 2F:
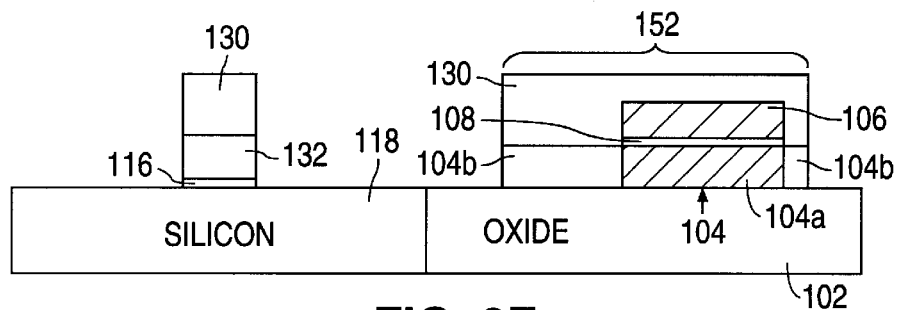
Figure 2G:
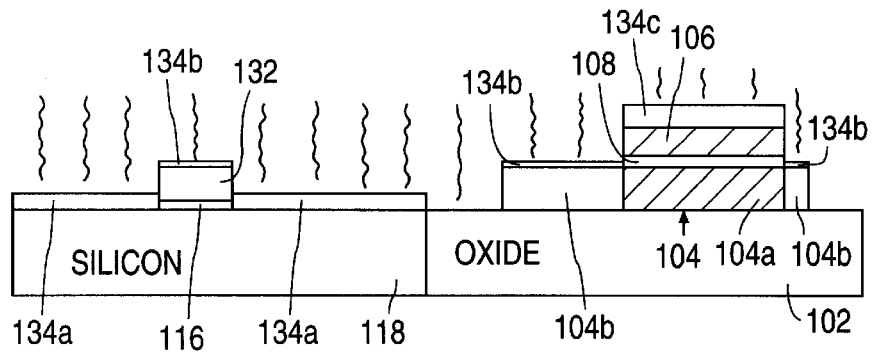
Figure 2H:
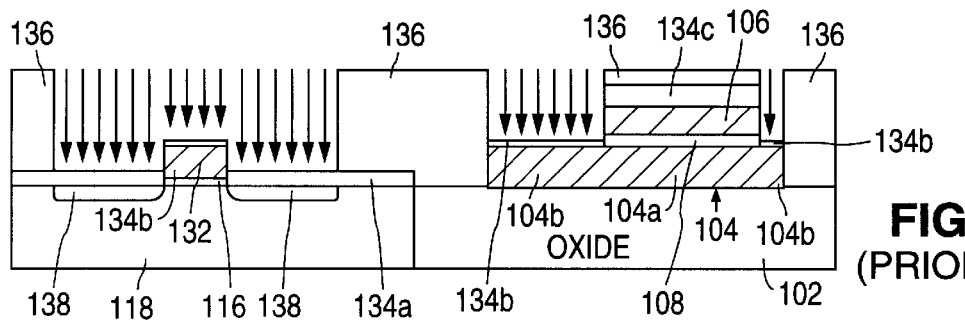
Figure 2I:
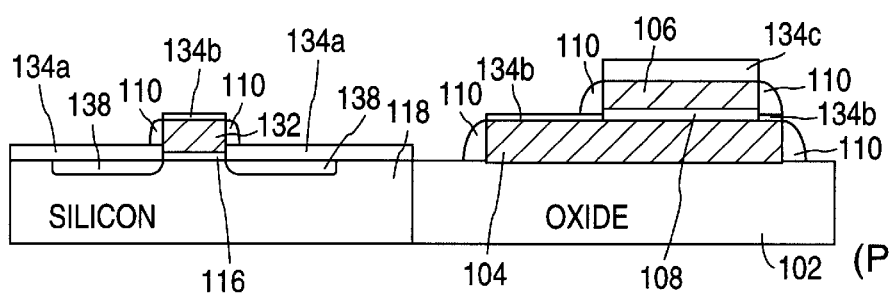
Figure 2J:
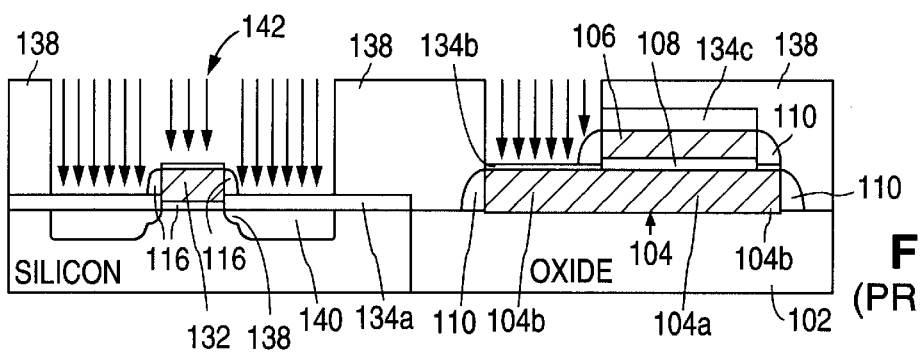
Figure 2K:
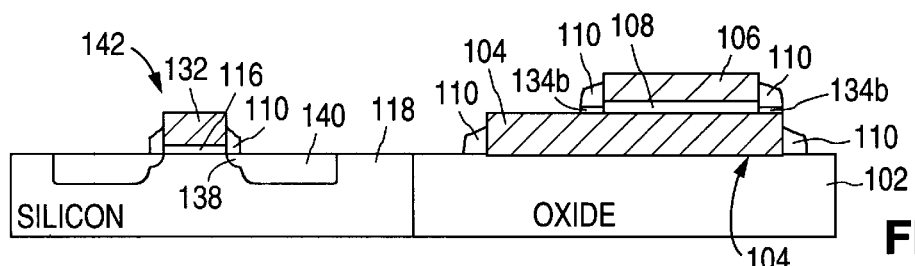
Figure 2L:
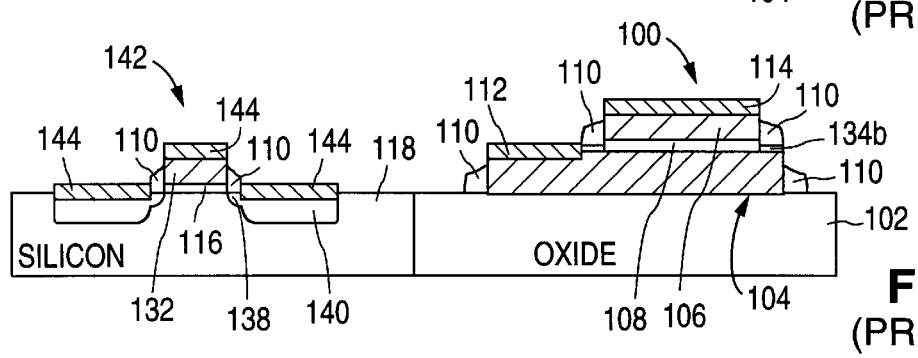
Figure 3A:
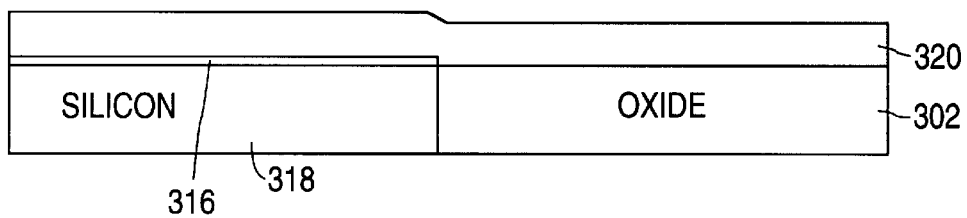
FIGS. 3A–3L show cross-sectional views of the process flow for forming a polysilicon-to-polysilicon capacitor structure in accordance with one embodiment of the present invention.

FIGS. 3A–3L show cross-sectional views of the process flow in accordance with one embodiment of the present invention. FIG. 3A shows the first step of this process, wherein gate oxide layer 316 is formed over single-crystal silicon region 318 adjacent to field oxide region 302. Gate polysilicon layer 320 is then formed over gate oxide 316 and field oxide 302.

Figure 3B:
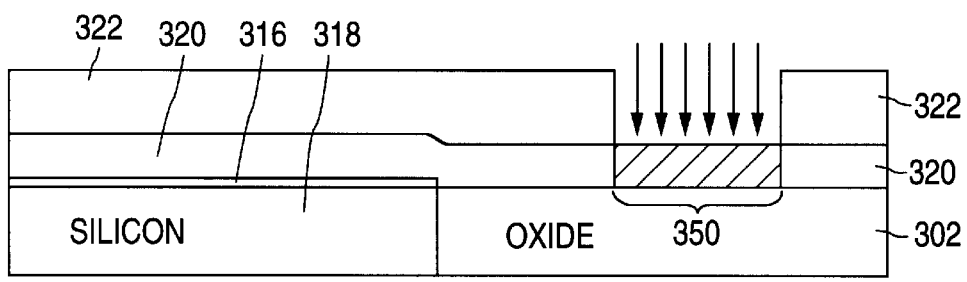

FIG. 3B shows the patterning of capacitor implant mask 322, followed by the ion implantation of conductivity-altering dopant into exposed first region 350 of gate polysilicon layer 320. Regions of gate polysilicon layer 320 exposed to implantation in this step will form part of the lower electrode of the capacitor device.

Figure 3C:
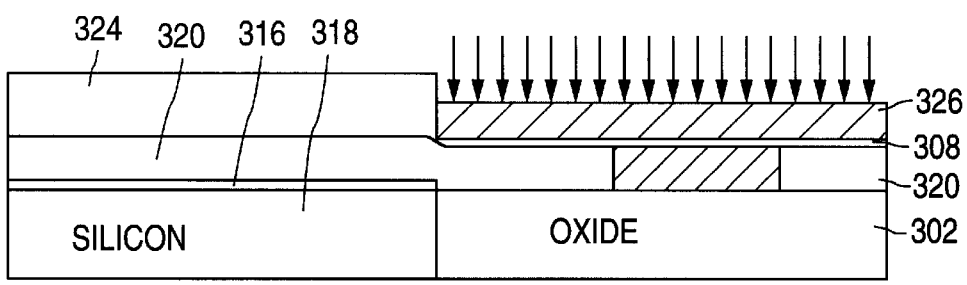

FIG. 3C shows removal of the capacitor implant mask, followed by formation of a CMOS mask 324 which covers single crystal silicon region 318. Capacitor oxide layer 308 is then formed over gate polysilicon layer 320, and gate polysilicon layer 326 is formed over capacitor oxide layer 308. Gate polysilicon layer 326 is then heavily doped by ion implantation.

Figure 3D:
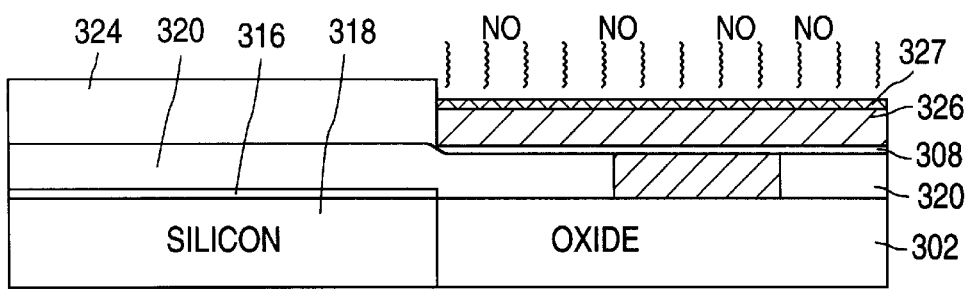

FIG. 3D shows the capacitor anneal step, wherein heavily doped capacitor polysilicon layer 326 is heated in the presence of nitrous oxide (NO) to promote even distribution of implanted dopant throughout the capacitor polysilicon layer.

Because of the NO ambient present during this step, nitroxide layer 327 is formed over the exposed surface of capacitor polysilicon layer 326. Nitroxide layer 327 acts as a barrier to diffusion of oxygen. Nitroxide layer 327 thus prevents any further oxidation of capacitor polysilicon layer 326. The oxidation barrier character of nitroxide are illustrated in TABLE 1, which compares the oxide growth resulting from oxidation of silicon vs. silicon bearing a nitroxide layer.

TABLE 1

| OXIDIZED SURFACE | OXIDE THICKNESS BEFORE SEAL OXIDATION (Å) | OXIDE THICKNESS AFTER SEAL OXIDATION (Å) |
|---|---|---|
| Single-crystal silicon | 0 | 78.8 |
| Single-crystal silicon bearing 35Å nitroxide layer | 34.4 | 35.4 |

Figure 3E:
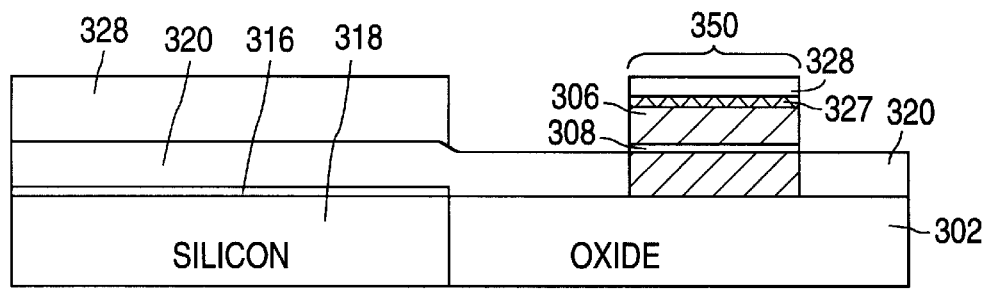

FIG. 3E shows formation of a capacitor poly mask 328 covering first region 350 and the portion of capacitor polysilicon layer 326 which will later form the upper capacitor electrode. Capacitor polysilicon layer 326 and capacitor oxide layer 308 in unmasked areas are then etched.

Figure 3F:
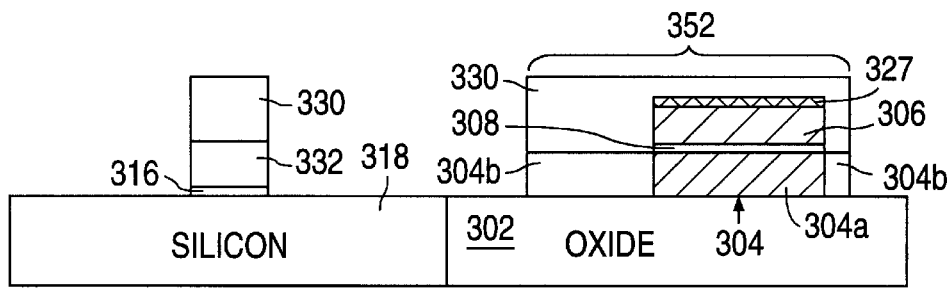

FIG. 3F shows removal of the capacitor poly mask, followed by patterning of gate poly mask 330 over a second region 352. Second region 352 is larger than an encompasses the first region. Gate poly mask 330 covers portions of gate polysilicon layer 326 that will form the lower electrode capacitor and the CMOS gate. Portions of gate polysilicon layer 326 excluded from mask 330 are then etched to form lower electrode 304 of the precursor capacitor, as well as gate 332 of the precursor CMOS device. At this point in the process, lower electrode 104 includes a heavily doped portion 104a and an undoped portion 104b.

Figure 3G:
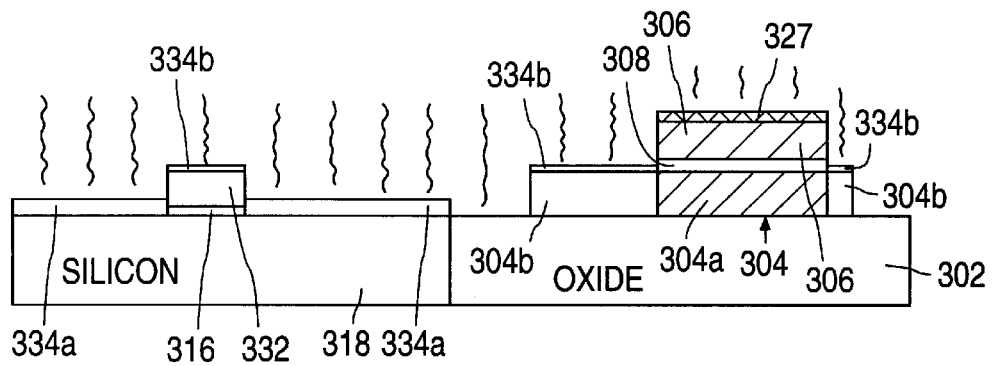

FIG. 3G shows exposing the precursor capacitor and CMOS structures to thermally oxidizing conditions. As a result of this step, seal oxide layer 334a is formed over the surface of single crystal silicon 318 and seal oxide layer 334b is formed over exposed surfaces of undoped portions 304b of lower polysilicon capacitor electrode 304 and gate 332. No seal oxide layer is formed over the heavily doped surface of upper polysilicon electrode 306 due to the presence of nitroxide barrier layer 327.

Figure 3H:
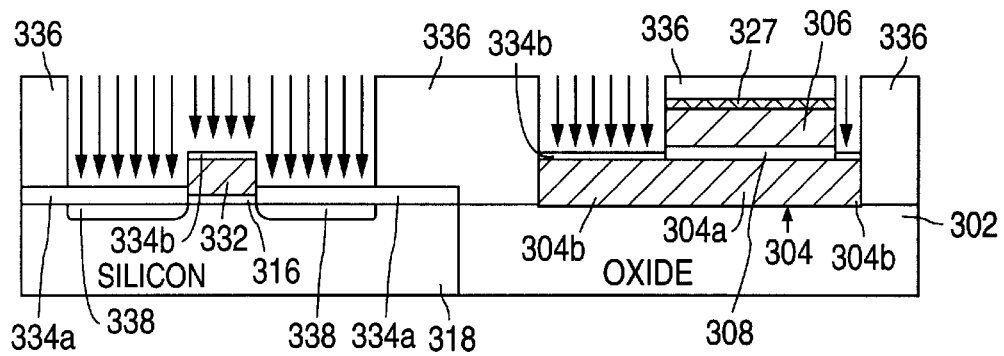

FIG. 3H shows formation of lightly-doped-drain (LDD) mask 336, followed by implantation of conductivity-altering dopant in unmasked regions to form LDD regions 338 in single-crystal silicon 318. During this step, dopant is also introduced into polysilicon gate 332 and into previously undoped portions 304b of lower electrode 304.

Figure 3I:
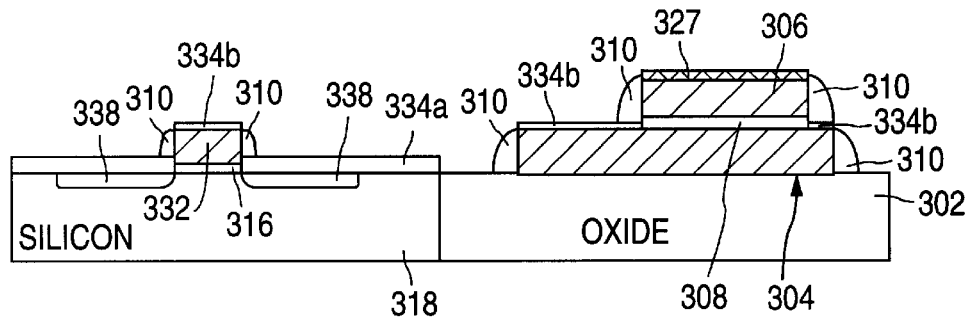

FIG. 3I shows removal of the LDD mask, followed by the formation of spacer structures 310. Spacer structures 310 are typically formed by anisotropic etching of a conforming deposited dielectric layer.

Figure 3J:
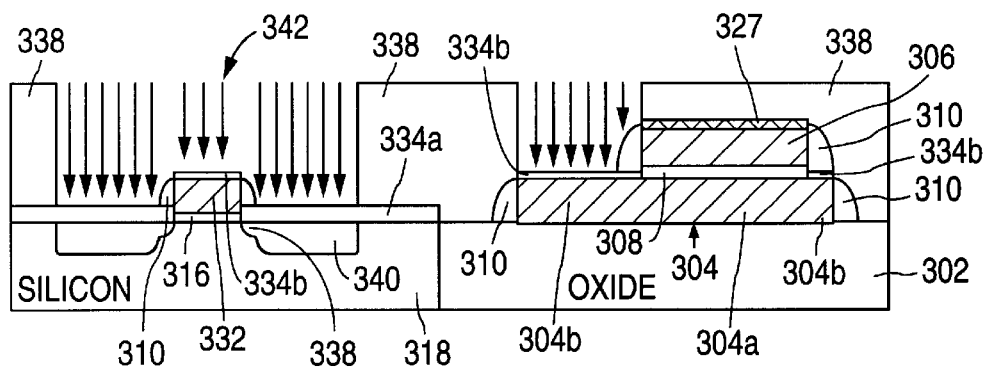

FIG. 3J shows patterning of source/drain mask 338, followed by implantation of relatively high doses of conductivity altering dopant into unmasked regions to form source/drain 340 of CMOS device 342. Also during this step, additional dopant is again introduced into previously undoped portion 304b of lower electrode 304, raising the doping of portion 304b to approximately that of doped portion 304a.

Figure 3K:
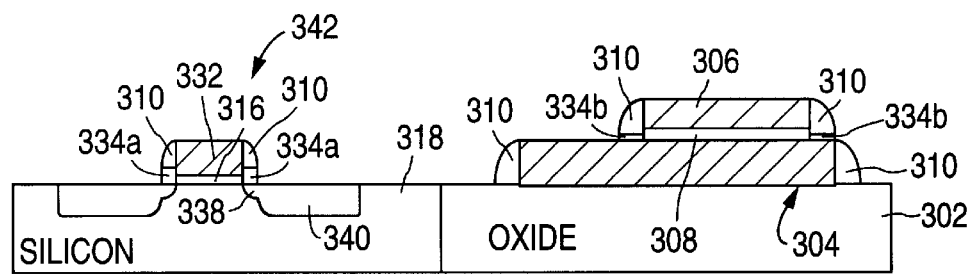

FIG. 3K shows the removal of seal oxide layers 334a, 334b, and nitroxide barrier layer 327, in preparation for forming silicided contacts with upper electrode 306 and lower electrode 304 of the capacitor structure, and also with source 340, gate 332, and drain 340 of CMOS device 342. Seal oxide layers 334a and 334b, and nitroxide barrier layer 327 may readily be removed using HF etchants.

Figure 3L:
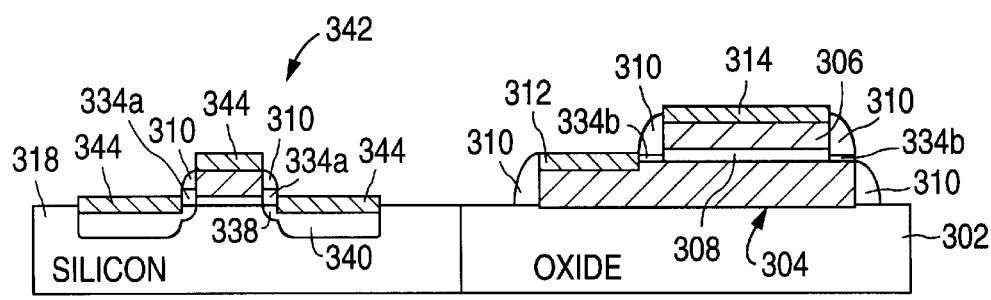

FIG. 3L shows formation of silicide contacts with the capacitor and CMOS device. Specifically, a silicide mask (not shown) is patterned which exposes the surface of upper capacitor electrode 306 and lower capacitor electrodes 304, as well as the surface of source 340, gate 332, and drain 340 of CMOS device 342. A layer of refractory metal is then formed over these exposed surfaces, and then the metal/silicon combination is alloyed to produce silicide contacts 312 and 314 over the upper and lower capacitor electrodes 306 and 304, and silicide contacts 344 with the source 340, gate 332, and drain 340 of the CMOS device. This step completes the front-end process flow for the polysilicon-to-polysilicon capacitor structure in accordance with one embodiment of the present invention.

The process flow in accordance with the present invention offers a number of important advantages over the conventional process. One important advantage of the present invention is that a thick oxide layer is prevented from being formed over the heavily doped upper polysilicon electrode, thereby facilitating formation of silicide contacts.

Another advantage of the capacitor in accordance with the present invention is its ready integration into existing process flows. Specifically, because the nitroxide barrier layer is formed during the existing capacitor anneal step, and because the nitroxide barrier layer is removed by the same etchant used to remove the seal oxides, no additional processing step is required by this embodiment of the present invention. All that is required is the substitution of NO for the $N_2$ ambient normally employed during the capacitor anneal step.

Although the invention has been described in connection with one specific preferred embodiment, it must be understood that the invention as claimed should not be unduly limited to this embodiment. Various other modifications and alterations in the structure and process will be apparent to those skilled in the art without departing from the scope of the present invention.

For example, while the above discussion describes formation of the oxidation barrier layer by annealing the heavily doped polysilicon in the presence of a nitrous oxide ambient, this is not required by the present invention. The nitroxide oxidation barrier layer could also be formed by carefully controlled thermal oxidation of the polysilicon, followed by thermal nitridation of the oxide layer in an ambient of ammonia ($NH_3$)

In yet another alternative embodiment of the present invention, two separate capacitor annealing steps may be required. FIGS. 3H and 3J illustrate a CMOS process wherein the gate structure of an associated CMOS device is independently doped at the time of LDD and source/drain implants. In this manner, gates of PMOS devices receive different doping than the gates of NMOS devices.

However, in older CMOS processes the MOS gate structures all receive the same type of doping, and the gate polysilicon layer is heavily doped immediately upon formation. Therefore, in order to make the process in accordance with the present invention compatible with such older CMOS processes, two capacitor anneal steps are performed to create a barrier nitroxide layer over the exposed surface of the heavily doped lower polysilicon capacitor electrode. This is shown in FIGS. 4A–4D.

Figure 4A:
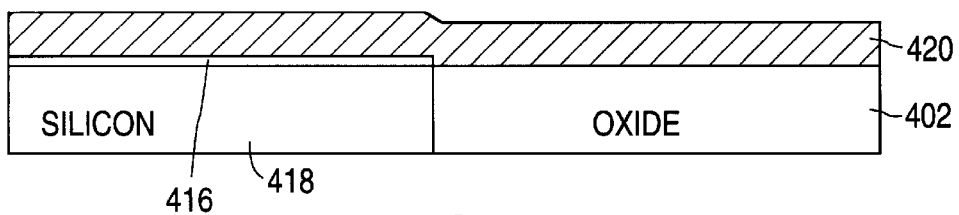
FIGS. 4A–4D shows cross-sectional views of the process flow for forming a polysilicon-to-polysilicon capacitor structure in accordance with an alternative embodiment of the present invention.
Figure 4B:
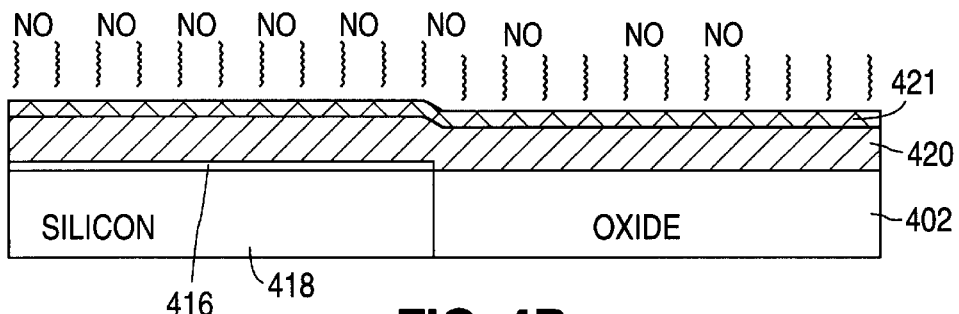

In FIG. 4A, the gate polysilicon layer 420 is uniformly heavily doped immediately upon formation, either in-situ or by ion implantation. This is because all of the gates the CMOS devices will have the same type of dopant. As a result, an initial capacitor anneal step in an NO ambient will form first nitroxide layer 421, thereby preventing overoxidation of gate polysilicon layer 420. This is shown in FIG. 4B.

Figure 4C:
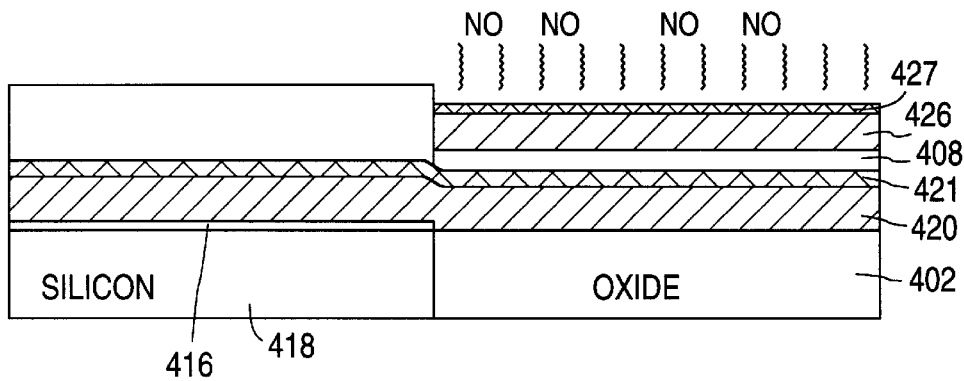

FIG. 4C shows the subsequent formation of capacitor oxide layer 408 and capacitor polysilicon layer 426, followed by performance of the second capacitor anneal step in an NO ambient to form second nitroxide layer 427.

Figure 4D:
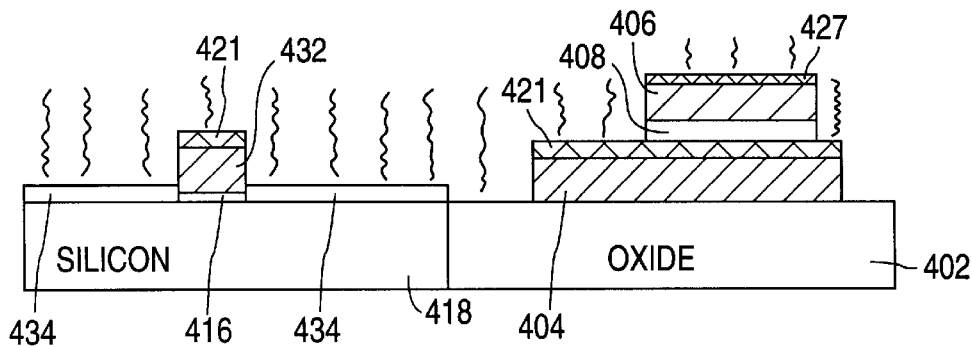

After etching of the structure to form upper polysilicon capacitor electrode 406 and lower polysilicon capacitor electrode 404, FIG. 4D shows the seal oxidation step, wherein the structure is exposed to oxidizing conditions and seal oxide layer 434 forms over single crystal silicon 418. During this step, first nitroxide layer 421 and second nitroxide layer 427 prevent over-oxidation of the surfaces of heavily doped lower and upper polysilicon electrodes 404 and 406, respectively. Front-end processing to complete formation of the capacitor and CMOS device then proceeds in the manner shown above in FIGS. 3H–3L.

It is also possible to create an oxidation barrier layer(s) composed of a material other than nitroxide (such as deposited silicon nitride) over the heavily doped polysilicon of the capacitor electrodes prior to the capacitor anneal step(s). However, this alternative embodiment suffers from a serious disadvantage in that the nitride must be removed prior to silicide formation using an etch chemistry distinct from that already employed to remove the seal oxide. Use of the second etch chemistry adds complexity to the process flow and thereby increases cost. Moreover, the phosphoric acid that must be used to remove the nitride barrier layer is highly reactive, and could damage the fragile gate oxide and spacer structures already present on the chip.

Given the above description and the variety of embodiments described therein, it is intended that the following claims define the scope of the present invention, and that the processes within the scope of these claims and their equivalents be covered hereby.

What is claimed is:

1. A process for forming a capacitor structure comprising the steps of:
    forming a gate polysilicon layer over a semiconductor workpiece;
    forming a gate oxide layer over the gate polysilicon layer;
    forming a capacitor polysilicon layer over the gate oxide layer;
    introducing conductivity-altering dopant into the capacitor polysilicon layer;
    forming a first nitroxide barrier layer over the capacitor polysilicon layer;
    creating an upper electrode of a capacitor structure by removing the first nitroxide barrier layer, the capacitor polysilicon layer, and the gate oxide layer to stop on the gate polysilicon layer outside of a first region;
    creating a lower electrode of the capacitor structure by removing the gate polysilicon layer to stop on the semiconductor workpiece outside of a second region, the second region larger than and encompassing the first region;
    removing the first nitroxide barrier layer over the upper capacitor electrode; and
    forming a silicide contact over the upper capacitor electrode and the lower capacitor electrode.

2. The process according to claim 1 wherein the step of forming a first nitroxide barrier layer comprises oxidizing the capacitor polysilicon layer in an ambient including nitrous oxide.

3. The process according to claim 1 wherein the step of forming a first nitroxide barrier layer comprises:
    oxidizing the capacitor polysilicon layer in an ambient to produce an oxide film; and
    exposing the oxide film to an ambient including ammonia.

4. The process according to claim 1 wherein the step of removing the first nitroxide barrier layer comprises exposing the first nitroxide barrier layer to HF etchant.

5. The process according to claim 1 wherein:
    the step of removing the gate polysilicon layer outside of the second region is coincident with the step of defining a gate of an associated CMOS device;
    the step of removing the first nitroxide barrier layer is coincident with the step of removing a seal oxide layer formed on the associated CMOS device; and
    the step of forming a silicide contact with the upper and lower capacitor electrodes is coincident with the step of forming silicide contacts with a source, drain, and gate of the associated CMOS device.

6. The process according to claim 1 further comprising the steps of:
    introducing conductivity-altering dopant into the gate polysilicon layer prior to formation of the gate oxide layer;
    forming a second nitroxide barrier layer over the gate polysilicon layer prior to formation of the gate oxide layer;
    creating the upper capacitor electrode by removing the first nitroxide barrier layer, the capacitor polysilicon layer, and the gate oxide layer outside of the first region to stop on the second nitroxide barrier layer; and
    removing the second nitroxide barrier layer over the lower capacitor electrode prior to form a silicide contact with the lower capacitor electrode.

7. The process according to claim 6 wherein the step of forming the first nitroxide barrier layer comprises oxidizing the capacitor polysilicon layer in an ambient including nitrous oxide, and the step of forming the second nitroxide barrier layer comprises oxidizing the gate polysilicon layer in an ambient including nitrous oxide.

8. The process according to claim 6 wherein:
    the step of forming the first nitroxide barrier layer comprises oxidizing the capacitor polysilicon layer in an ambient to produce an oxide film, and then exposing the oxide film to an ambient including ammonia; and
    the step of forming the second nitroxide barrier layer comprises oxidizing the gate polysilicon layer in an ambient to produce an oxide film, and then exposing the oxide film to an ambient including ammonia.

9. The process according to claim 6 wherein the step of removing the first nitroxide barrier layer and the second nitroxide barrier layer comprises exposing the first and second nitroxide barrier layers to HF etchant.

10. The process according to claim 6 wherein:
    the step of introducing conductivity-altering dopant into the gate polysilicon layer prior to formation of the gate oxide layer is coincident with the step of doping a gate of an associated CMOS device;
    the step of removing the gate polysilicon layer outside of the second region is coincident with the step of defining the gate of the associated CMOS device;
    the step of removing the first nitroxide barrier layer over the upper electrode and the second nitroxide barrier layer over the lower electrode is coincident with the step of removing a seal oxide layer formed on the associated CMOS device; and
    the step of forming a silicide contact with the upper and lower capacitor electrodes is coincident with the step of forming silicide contacts with a source, drain, and gate of the associated CMOS device.

11. A process for forming a capacitor structure comprising the steps of:
   forming a gate polysilicon layer over a semiconductor workpiece;
   introducing conductivity-altering dopant into a first region of the gate polysilicon layer;
   forming a gate oxide layer over the gate polysilicon layer;
   forming a capacitor polysilicon layer over the gate oxide layer;
   introducing conductivity-altering dopant into the capacitor polysilicon layer;
   forming a first nitroxide barrier layer over the capacitor polysilicon layer;
   creating an upper electrode of a capacitor structure by removing the nitroxide barrier layer, the capacitor polysilicon layer, and the gate oxide layer to stop on the gate polysilicon layer outside of the first region;
   creating a lower capacitor electrode by removing the gate polysilicon layer to stop on the semiconductor workpiece outside of a second region, the second region larger than and encompassing the first region, the lower capacitor electrode having a doped portion corresponding to the first region and an undoped contact portion corresponding to outside of the first region;
   performing a seal oxidation step;
   introducing conductivity-altering dopant into the undoped contact portion of the lower electrode;
   removing the first nitroxide barrier layer over the upper capacitor electrode after the seal oxidation step; and
   forming a silicide contact over the upper capacitor electrode and the contact portion of the lower capacitor electrode.

12. The process according to claim 11 wherein the step of forming a first nitroxide barrier layer comprises oxidizing the capacitor polysilicon layer in an ambient including nitrous oxide.

13. The process according to claim 11 wherein the step of forming a first nitroxide barrier layer comprises:
   oxidizing the capacitor polysilicon layer in an ambient to produce an oxide film; and
   exposing the oxide film to an ambient including ammonia.

14. The process according to claim 11 wherein the step of removing the first nitroxide barrier layer comprises exposing the first nitroxide barrier layer to HF etchant.

15. The process according to claim 11 wherein:
   the step of removing the gate polysilicon layer outside of the second region is coincident with the step of defining a gate of an associated CMOS device;
   the step of introducing conductivity-altering dopant into the undoped contact portion of the lower electrode is coincident with doping a source and a drain of the associated CMOS device;
   the step of removing the first nitroxide barrier layer is coincident with the step of removing a seal oxide layer formed on the associated CMOS device during the seal oxidation step; and
   the step of forming a silicide contact with the upper and lower capacitor electrodes is coincident with the step of forming silicide contacts with a source, drain, and gate of the associated CMOS device.

16. The process according to claim 11 wherein the step of introducing conductivity-altering dopant into the gate polysilicon layer comprises introducing conductivity-altering dopant into the entire gate polysilicon layer, and wherein the process further comprises the steps of:
   forming a second nitroxide barrier layer over the gate polysilicon layer prior to formation of the gate oxide layer;
   creating the upper capacitor electrode by removing the first nitroxide barrier layer, the capacitor polysilicon layer, and the gate oxide layer outside of the first region to stop on the second nitroxide barrier layer over a contact portion of the lower capacitor electrode; and
   removing the second nitroxide barrier layer over the contact portion prior to forming a silicide contact.

17. The process according to claim 16 wherein the step of forming the first nitroxide barrier layer comprises oxidizing the capacitor polysilicon layer in an ambient including nitrous oxide, and the step of forming the second nitroxide barrier layer comprises oxidizing the gate polysilicon layer in an ambient including nitrous oxide.

18. The process according to claim 16 wherein:
   the step of removing the gate polysilicon layer outside of the second region is coincident with the step of defining the gate of the associated CMOS device;
   the step of removing the first nitroxide barrier layer over the upper electrode and the second nitroxide barrier layer over the lower electrode is coincident with the step of removing a seal oxide layer formed on the associated CMOS device; and
   the step of forming a silicide contact with the upper and lower capacitor electrodes is coincident with the step of forming silicide contacts with a source, drain, and gate of the associated CMOS device.

19. A method for forming silicide contacts on doped polysilicon capacitor electrodes, the method comprising:
   introducing conductivity-altering dopant into a polysilicon electrode of a capacitor device;
   forming an oxidation barrier layer over the doped polysilicon electrode prior to performing any subsequent oxidation steps;
   removing the oxidation barrier layer;
   exposing the doped polysilicon electrode to a silicide-forming metal; and
   annealing the doped polysilicon electrode.

20. The method according to claim 19 wherein:
   the step of forming an oxidation barrier layer over the doped polysilicon electrode comprises exposing the doped polysilicon electrode to an ambient of nitrous oxide; and
   the step of removing the oxidation barrier layer comprises exposing the oxidation barrier layer to HF etchant.

* * * * *